(12) United States Patent
Focia

(10) Patent No.: US 9,742,394 B2
(45) Date of Patent: Aug. 22, 2017

(54) HIGH-VOLTAGE, HIGH-CURRENT, SOLID-STATE CLOSING SWITCH

(71) Applicant: Sandia Corporation, Albuquerque, NM (US)

(72) Inventor: Ronald Jeffrey Focia, Edgewood, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 66 days.

(21) Appl. No.: 14/305,148

(22) Filed: Jun. 16, 2014

(65) Prior Publication Data

US 2015/0365086 A1  Dec. 17, 2015

(51) Int. Cl.
*H03K 17/56* (2006.01)
*H03K 17/72* (2006.01)

(52) U.S. Cl.
CPC ............. *H03K 17/56* (2013.01); *H03K 17/72* (2013.01)

(58) Field of Classification Search
CPC ..... H03K 17/08144; H03K 2217/0036; H03K 17/56; H03K 17/76; H02M 1/096
USPC .......................... 327/199, 207, 208, 438, 441
See application file for complete search history.

(56) References Cited

U.S. PATENT DOCUMENTS

| | | | | |
|---|---|---|---|---|
| 3,231,758 A | * | 1/1966 | Diamant | H03K 17/30 326/130 |
| 5,861,639 A | * | 1/1999 | Bernier | H01L 29/7404 257/112 |
| 6,710,994 B1 | * | 3/2004 | Deam | H02M 1/096 361/100 |
| 9,042,065 B2 | * | 5/2015 | Van Wijmeersch | H01L 27/0262 361/111 |

OTHER PUBLICATIONS

W. H. Schroen, "Characteristics of a High-Current, High-Voltage Shockley Diode," IEEE Trans. Electron Devices, ED-17, No. 9, 694 (1970).

* cited by examiner

*Primary Examiner* — Lincoln Donovan
*Assistant Examiner* — Colleen O Toole
(74) *Attorney, Agent, or Firm* — Kevin W. Bieg

(57) ABSTRACT

A high-voltage, high-current, solid-state closing switch uses a field-effect transistor (e.g., a MOSFET) to trigger a high-voltage stack of thyristors. The switch can have a high hold-off voltage, high current carrying capacity, and high time-rate-of-change of current, di/dt. The fast closing switch can be used in pulsed power applications.

9 Claims, 6 Drawing Sheets

HIGH-VOLTAGE, HIGH-CURRENT, SOLID-STATE CLOSING SWITCH

STATEMENT OF GOVERNMENT INTEREST

This invention was made with Government support under contract no. DE-AC04-94AL85000 awarded by the U. S. Department of Energy to Sandia Corporation. The Government has certain rights in the invention.

FIELD OF THE INVENTION

The present invention relates to thyristors and, in particular, a hybrid high-voltage, high-current, solid-state closing switch and a method for triggering three-terminal thyristors for high time rate of change of current (di/dt) applications.

BACKGROUND OF THE INVENTION

A thyristor is typically a two- or three-terminal solid-state semiconductor device with four layers of alternating n- and p-type semiconductor material. It is a bistable switch (i.e., a rectifier) that conducts when its gate receives a current trigger, and continues to conduct as long as it is forward biased (i.e., as long as the voltage across the device is not reversed). A three-terminal thyristor controls the large current of its two terminals (i.e., the anode and the cathode) with a smaller current supplied to a control, or gate, terminal. A two-terminal thyristor is designed to switch on if the potential difference across the anode and cathode exceeds a breakdown voltage (i.e., the potential difference provides a switching overvoltage). Because thyristors can control a relatively large amount of power in a small device, they are frequently used in power-switching circuits to control electrical power.

A Shockley diode has a four-layer p-n-p-n structure and is essentially a thyristor without a gate terminal. A thyristor or Shockley diode structure can be switched to the on state by several different mechanisms. See, e.g., F. E. Gentry et al., *Semiconductor Controlled Rectifiers*, Englewood Cliffs, N.J.: Prentice-Hall (1964); S. M. Sze, *Physics of Semiconductor Devices*, New York: Wiley, pp. 319-340 (1969); W. Shockley, *Electrons and Holes in Semiconductors*, Princeton, N.J.: Van Nostrand, pp. 111-114 (1950); and J. J. Ebers, "Four Terminal p-n-p-n transistors," *Proc. IRE* 40, 1361 (1952). The Shockley diode was originally used for low voltage and low current applications in telephone switching circuits. Thyristors can carry high currents but are not generally considered fast switching devices due to their turn on mechanism, i.e. plasma spreading from the gate region to modulate the conductivity of the base regions. As such, if a large current is supplied to a thyristor too quickly, i.e. a high di/dt, the device will fail due to filamentation and destruction of one or more p-n junctions within the device. The Shockley diode structure itself can be used as a closing switch in numerous applications if its hold-off voltage and cross-sectional area are set appropriately. In the late 1960's and early 1970's, Schoen developed a high-current and high-voltage Shockley diode structure for power modulator applications. See W. H. Schroen, "Characteristics of a High-Current, High-Voltage Shockley Diode," IEEE Trans. Electron Devices, ED-17, No. 9, 694 (1970). Schroen's focus was on providing a two-terminal closing switch for high current and high voltage applications. As shown in FIG. 1, Schroen proposed a switch 10 that used Shockley diodes 13 connected serially to form a high voltage stack 12. A blocking diode 11 at the bottom (i.e., cathode terminal) of the high voltage stack 12 of Shockley diodes 13 was necessary for application of the switching overvoltage to the anode and cathode terminals of the stack. Unfortunately, Shockley diodes are no longer commercially available. In wide-spread use today is Shockley-like thyristor structure called a transient voltage suppressors (TVS).

Therefore, a need remains for a high-voltage, high-current, high di/dt solid-state closing switch and a method for triggering three-terminal thyristors for high di/dt applications.

SUMMARY OF THE INVENTION

The present invention is directed to a high-voltage, high-current solid-state closing switch, comprising a stack comprising two or more thyristors arranged in a series and/or parallel arrangement, the stack having an anode terminal and a cathode terminal; a blocking diode having an anode terminal and a cathode terminal, wherein the anode terminal of the blocking diode is electrically connected to the cathode terminal of the stack; a trigger capacitor having a first terminal connected to the cathode terminal of the stack and the anode terminal of the blocking diode; a field-effect transistor having a drain electrically connected to the second terminal of the trigger capacitor and a source electrically connected to the cathode terminal of the blocking diode; means for charging the trigger capacitor to below the maximum reverse hold-off voltage of the blocking diode; and means for applying a voltage between the anode terminal of the stack and the cathode terminal of the blocking diode, such that the voltage applied to the stack is less than the rated self-break voltage of the stack; wherein the stack is switched to the on state when a trigger is applied to the gate terminal of the field-effect transistor. The thyristors can comprise two-terminal or three-terminal thyristors. A current limiting resistor can be placed between the gate of a three-terminal thyristor and the cathode terminal of the blocking diode in order to limit the current that is supplied to the gate of the thyristor for switching the device to the on state.

The switch can be made from commercial off-the-shelf (COTS) packaged components and can provide a high hold-off voltage, large current carrying capability, low switching time delay, low jitter, and a large time-rate-of-change of current (di/dt) that rivals or exceeds the capability of other logic-level triggered closing switches. The switch can have high voltage hold-off (limited only by the various breakdown effects of the stack), high pulsed current capability (greater than 1 kA), fast closure time (less than 100 ns), low delay time (less than 100 ns), low jitter (less than 5 ns), high di/dt (greater than 20 kA/µs), and high dV/dt immunity. Further, the switch only requires a logic-level trigger and a gate bias is not required to keep the switch in the off state. The switch can also be integrated at the chip level to provide low inductance and a compact switch package.

The closing switch can be used in numerous pulsed power applications. Stacking multiple low-voltage thyristors in series has the benefit of combining each thyristor's capacitance in series for a lower overall capacitance (capacitors in series add like resistors in parallel). This is desirable from the standpoint of less coupling of the trigger pulse to the load. Additionally, lower voltage devices switch to the on state faster due to their reduced base region lengths. Multiple three-terminal thyristors can be combined in parallel to increase the overall peak current handling capability.

BRIEF DESCRIPTION OF THE DRAWINGS

The detailed description will refer to the following drawings, wherein like elements are referred to by like numbers.

DETAILED DESCRIPTION OF THE INVENTION

Figure 1:
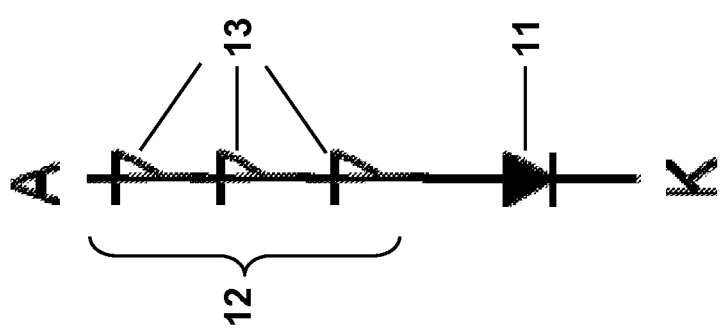
FIG. 1 is a schematic illustration of Schroen's high-voltage Shockley diode switch.
Figure 2:
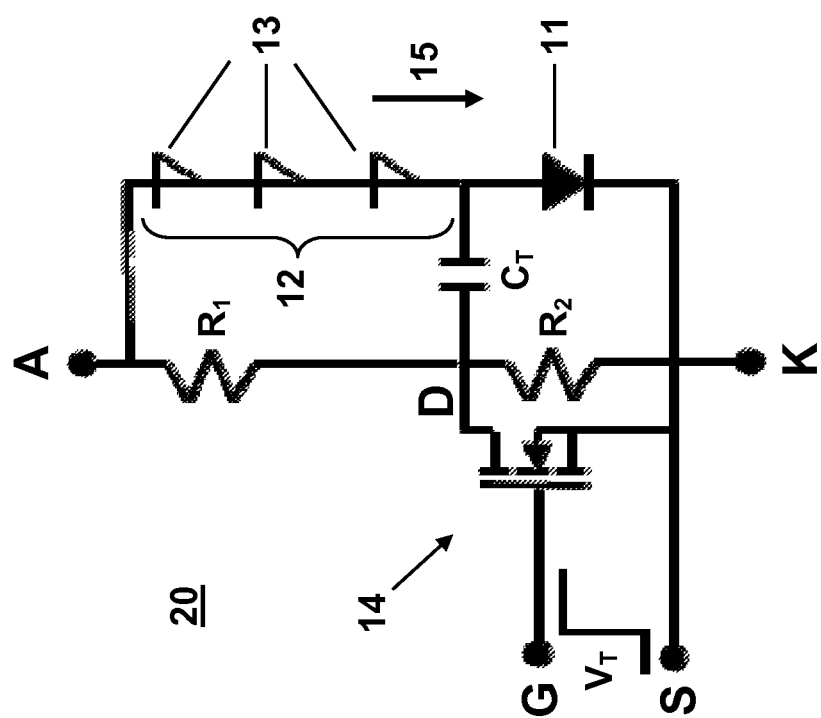
FIG. 2 is a schematic illustration of closing switch comprising a MOSFET-triggered thyristor stack.

According to an embodiment of the present invention, in order to apply an overvoltage to a Shockley diode or TVS thyristor stack 12 with a high dV/dt, a fast switching metal-oxide-semiconductor field-effect transistor (MOSFET) 14 can be used in the triggering circuit, as shown in FIG. 2. The switch 20 will operate in the intended manner when the voltage applied to the stack 12 is approximately 85-90% if the self-break voltage. As such, the range of hold-off voltage accommodated by this exemplary switch 20 is limited. However, various incremental hold-off voltage levels can be implemented by stacking the appropriate number of two-terminal thyristors, 13, in series. Application of a high voltage to the anode A of the switch 20 charges a triggering capacitor $C_T$ through the blocking diode 11 to some fraction of the applied voltage as determined by the voltage divider resistor values $R_1$ and $R_2$. The voltage on the triggering capacitor $C_T$ must be kept below the maximum hold-off voltage of the triggering MOSFET 14 and the maximum reverse hold-off voltage of the blocking diode 11. At 85-90% of the stack self-break voltage, the leakage current in the thyristors 13 starts to increase due to avalanche multiplication. This is beneficial as the thyristors in the series stack 13 will share voltage without requiring an external resistor biasing network. This leakage current can be on the order of tens of micro Amperes (μA).

To trigger the switch 20, a positive voltage $V_T$ is applied to the gate G of the n-channel MOSFET 14, typically via a MOSFET driver. Closure of the MOSFET 14 applies a negative voltage (with respect to the cathode of the blocking diode 11) from the drain D to the anode side of the blocking diode 11 and attempts to discharge the trigger capacitor $C_T$. Since there are only leakage current paths for the trigger capacitor $C_T$ to discharge through, i.e. the now reverse biased blocking diode 11 and the thyristors 13 that are still in a voltage hold-off mode, the time constant for discharge of this capacitor $C_T$ is large (~100's μs) compared to the turn-on time of the main current path 15 (<100 ns). Since the blocking diode 11 is now reverse biased, no current flows through the main current path 15 until the thyristors 13 close, i.e. switch to the on state. The voltage across the thyristor stack 12 is now much greater than its self-break voltage and results in closure of these diodes 13 via avalanche multiplication without carrying significant current. Once the thyristors 13 close, the trigger capacitor $C_T$ discharges rapidly allowing forward bias of the blocking diode 11 and current to flow through the main current path 15. The thyristors 12 will remain in the on state until current flow through them falls below some small holding current typically on the order of tens of milliamps. Therefore, no significant current will flow though a load path until the thyristors are in the on state. As such, a high di/dt can be achieved because the diodes 12 are in the on state prior to carrying any significant current, thus avoiding non-uniform turn on and filamentation in the switch which can quickly lead to device failure.

Figure 3:
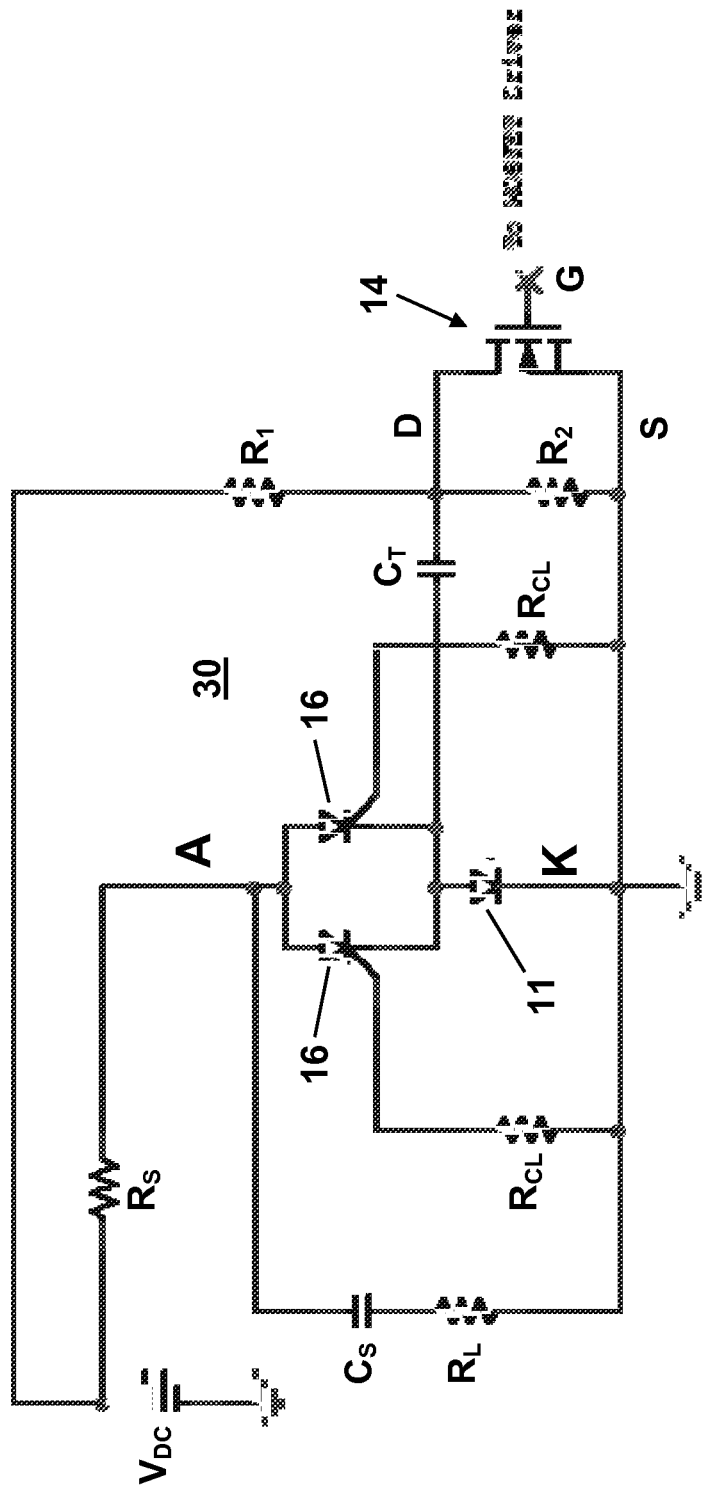
FIG. 3 is a schematic illustration of a closing switch comprising a MOSFET-triggered thyristor stack and a current limiting resistor.

Another embodiment of the invention is shown schematically in FIG. 3. According to this switch 30, simply adding a current limiting resistance $R_{CL}$ from the gate of a thyristor 16 to ground potential (or the potential at the cathode of the blocking diode) enables the switch 30 to trigger by allowing current to be drawn into the gate terminal of the thyristors. According to this example, two three-terminal thyristors 16 are placed in parallel in order to increase the current handling capability of the switch 30. Any number of thyristors can be placed in parallel, depending on the current handling capacity required. Operation of the switch 30 is similar to that described previously for switch 20. High voltage $V_{DC}$ is applied to the circuit, thus charging a main storage capacitor $C_S$ and the trigger capacitor $C_T$ to some fraction of the applied voltage. To trigger the switch 30, a positive voltage is applied to the gate G of the n-channel MOSFET 14 typically via a MOSFET driver. Closure of the MOSFET 14 applies a negative voltage (with respect to ground or the cathode of the blocking diode) at the anode side of the blocking diode 11 and attempts to discharge the trigger capacitor $C_T$. The gate terminals of the thyristors 16 are now at a higher potential than the cathodes, thus drawing current into them. Since the blocking diode 11 is now reverse biased, no current flows through the main current path from A to K until the thyristors 16 close, i.e. switch to the on state. The voltage across the thyristors 16 can be much greater that their self-break voltage, resulting in closure of the thyristors 16 via avalanche multiplication under low current in addition to carrier injection into the gates. Once the thyristors 16 close, the trigger capacitor $C_T$ discharges more rapidly allowing forward bias of the blocking diode 11 and current to flow through the main current path. The thyristors 16 will remain in the on state until current flow through them falls below some small holding current typically on the order of tens of milliamps. With this switch 30, no significant current will flow though the load $R_L$ until the thyristors 16 are in the closed state. As such, a high di/dt can be achieved because the thyristors 16 are in the closed state prior to carrying any significant current, thus avoiding non-uniform turn on and filamentation in the device which can quickly lead to device failure.

To provide a solid-state switch that only requires a logic level trigger signal to switch the device, the MOSFET, the blocking diode, the thyristor or thyristor stack, and the passive components (two biasing resistors and the trigger capacitor) can be integrated at the chip level. However, integrating relatively inexpensive packaged devices such as the MOSFET, trigger capacitor, and biasing resistors at the chip-level can add significant cost to the switch. However, incorporating the actual switching elements (i.e. blocking diode and thyristor stack) only at the chip level can reduce inductance and still provide a three-terminal switch. The examples below used only the switching elements integrated on chip.

As an example, a switch of the type shown in FIG. 3 was constructed using two high efficiency thyristors and a SiC Schottky diode at the cathode terminal of the high voltage stack. The switch was triggered using an n-channel enhancement mode MOSFET-driver combination. The values of the passive components were $C_T$=136 nF, $C_S$=200 nF, $R_S$=15 kΩ, $R_1$=10 MΩ, $R_2$=10 MΩ, $R_{CL}$=8.2Ω, and $R_L$=1 mΩ. The applied voltage was $V_{DC}$=1200 V.

Figure 4:
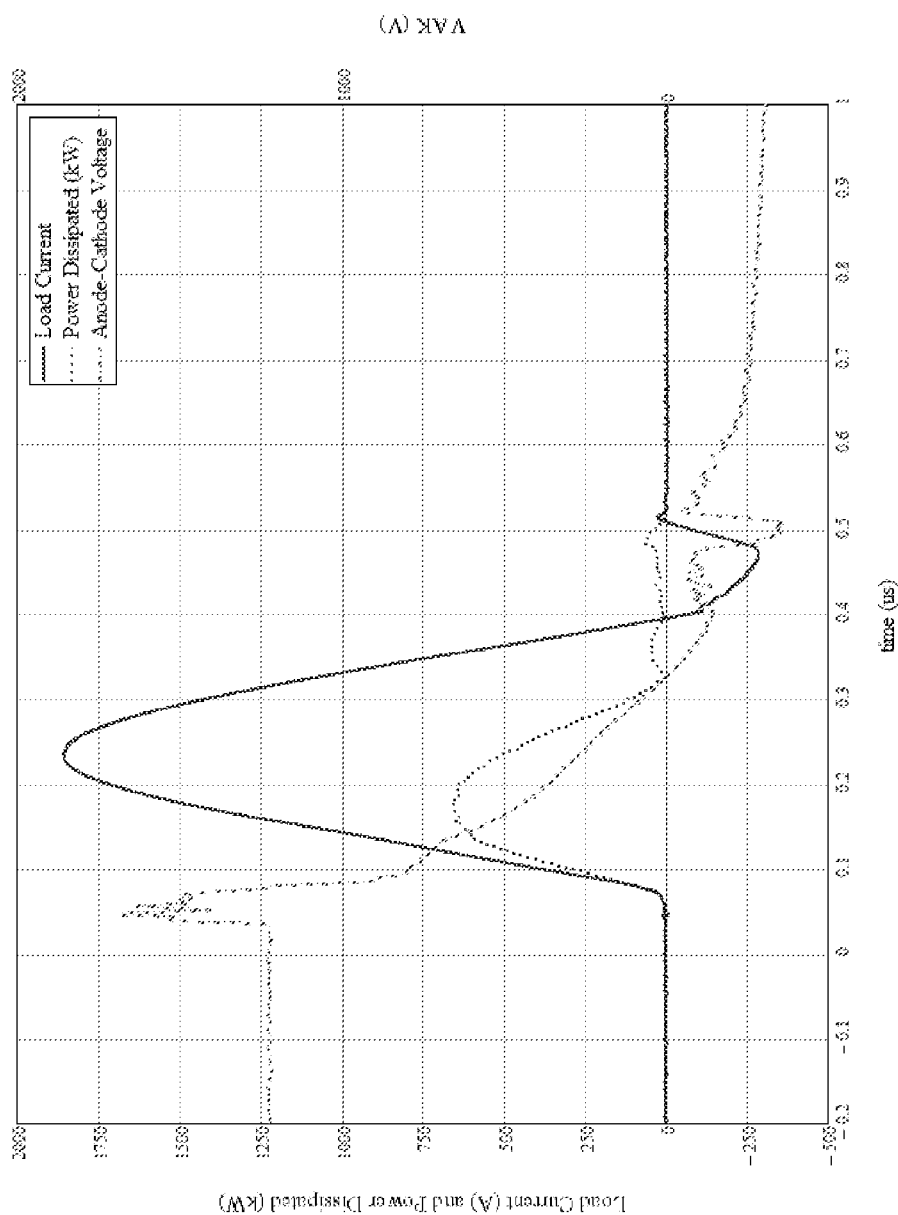
FIG. 4 is a graph of current, voltage, and power waveforms generated using the closing switch of FIG. 3.

Waveforms for this exemplary switch are shown in FIG. 4. Although this switch and circuit was not optimized for minimal inductance, the performance achieved with the two parallel thyristors using this triggering method was:

The jitter was <1 ns,
The delay time from application of the trigger signal to the MOSFET driver to current rise in the load circuit was ~68 ns,
The switch transition time was ~108 ns,
The time rate-of-change of current di/dt was 14.6 kA/μs, and
The peak current was 1856 A.

On a per-thyristor basis, the di/dt achieved exceeded the maximum specified in the manufacturer's data sheet by more than an order of magnitude. This method of triggering results in better di/dt performance, due to electric field and dV/dt assisted plasma spreading in the thyristor base regions, and the blocking diode not allowing significant current to flow in the thyristors until it is forward biased.

Figure 5:
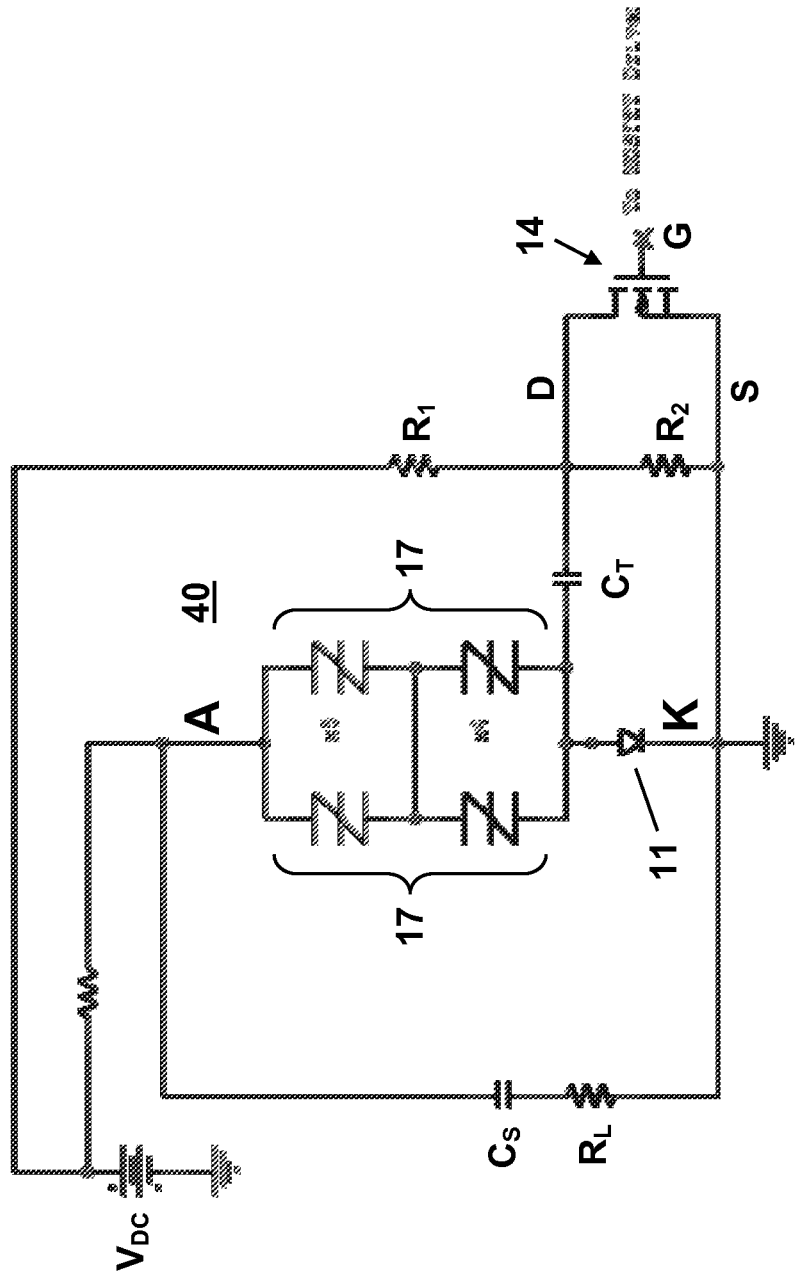
FIG. 5 is a schematic illustration of a closing switch comprising a MOSFET-triggered thyristor stack arranged in a series/parallel configuration.

A variety of thyristor structures can be used in the closing switch circuit. FIG. 5 shows an exemplary switch 40 that uses a series/parallel thyristor structure 17. As an example, transient voltage suppressor thyristors were used to make an exemplary switch. The TVS thyristor is a two-terminal thyristor structure designed to be triggered to the on state by overvoltage and also to carry. These thyristors are typically only available with a maximum breakover voltage of ~360V and are available in a surface mount package which is amenable to series stacking in a small volume. In order to make a ~3 kV hold-off switch, nine of these thyristors can be stacked in series. The high voltage switch element was formed by stacking two parallel strings of nine TVS thyristor devices in series so as not to burn out the devices during high current pulse testing. The blocking diode that was used at the cathode end of the high voltage stack was a SiC Schottky diode rated for a 1.2 kV blocking voltage and a 99 A continuous current. The switch was triggered using an n-channel enhancement mode MOSFET. The values of the passive components were $C_T$=45 nF, $C_S$=50 nF, $R_S$=15 kΩ, $R_1$=30 MΩ, $R_2$=15 MΩ, and $R_L$=0.2Ω. The applied voltage was $V_{DC}$=2950 V. The test circuit had a load path inductance of ~112 nH such that the achievable di/dt was limited by the high voltage switch.

Figure 6:
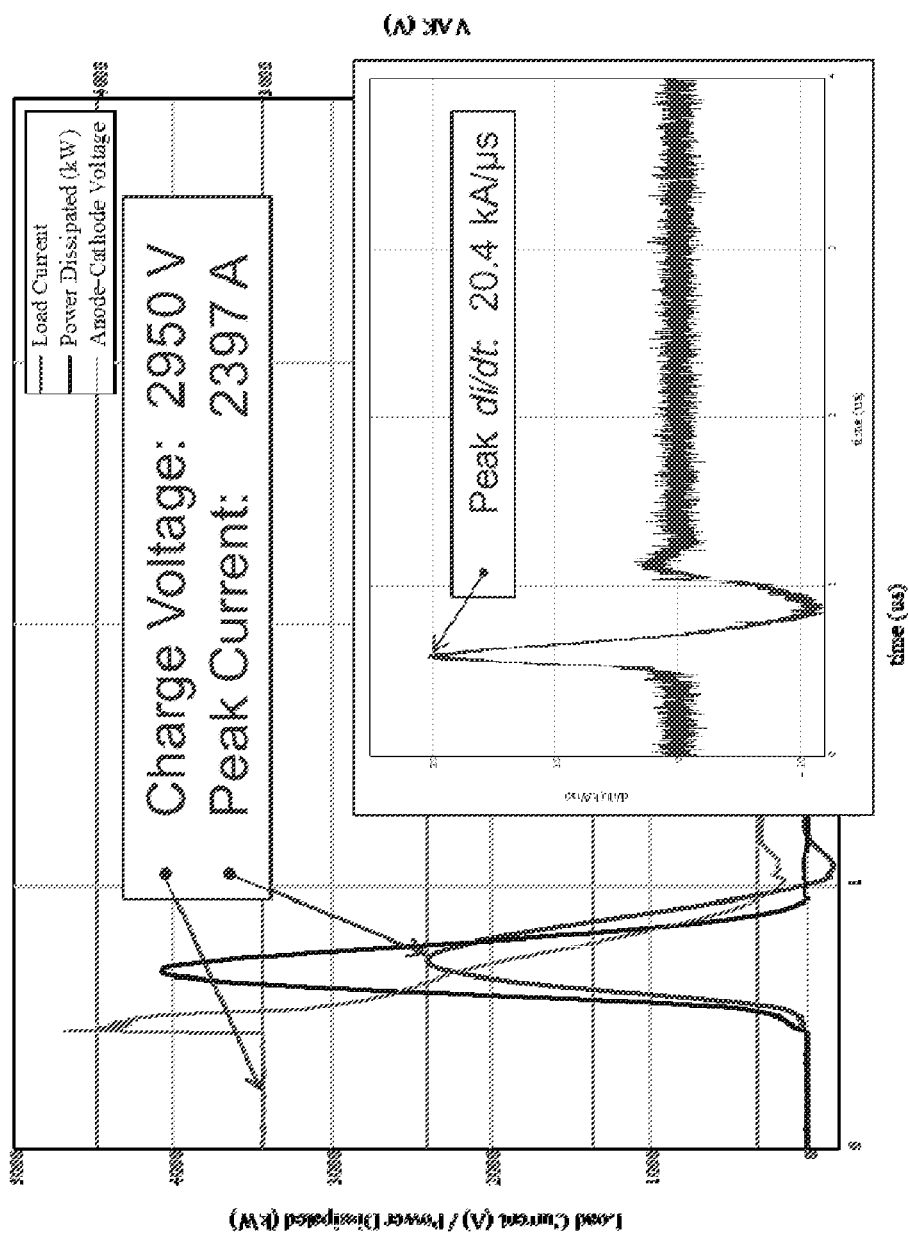
FIG. 6 is a graph of current, voltage, and power waveforms generated using the closing switch of FIG. 5.

The stack anode-to-cathode voltage, load current, power dissipated in the switch, and load current di/dt waveforms for the low inductance test circuit are shown in FIG. 6. The low inductance test circuit allowed achieving the following switch performance:

The jitter was <1 ns.
The delay time from application of the trigger signal to device switching is ~16 ns.
The switching transition time was ~120 ns.
A time rate-of-change of current, di/dt, of 20.4 kA/μs.
The peak current was ~2400 A Further improvements in switch performance can be obtained by fabricating a chip-level TVS thyristor/diode stack. The switch can also use packaged COTS devices.

The present invention has been described as a high-voltage, high-current, solid-state closing switch and a new method for triggering thyristors for high di/dt applications. It will be understood that the above description is merely illustrative of the applications of the principles of the present invention, the scope of which is to be determined by the claims viewed in light of the specification. Other variants and modifications of the invention will be apparent to those of skilled in the art.

I claim:

1. A high-voltage, high-current solid-state closing switch, comprising:
  a thyristor stack comprising two or more thyristors arranged in a series and/or parallel arrangement, the thyristor stack having an anode terminal and a cathode terminal;
  a blocking diode having an anode terminal and a cathode terminal, wherein the anode terminal of the blocking diode is electrically connected to the cathode terminal of the thyristor stack;
  a trigger capacitor having a first terminal and a second terminal, wherein the first terminal is electrically connected to the cathode terminal of the thyristor stack and the anode terminal of the blocking diode which enables charging of the trigger capacitor through the blocking diode;
  a field-effect transistor having a drain electrically connected to the second terminal of the trigger capacitor and a source electrically connected to the cathode terminal of the blocking diode;
  a means for charging the trigger capacitor to below the maximum reverse hold-off voltage of the blocking diode; and
  a means for applying a voltage between the anode terminal of the thyristor stack and the cathode terminal of the blocking diode, such that the voltage applied to the thyristor stack is less than the self-break voltage of the thyristor stack;
  wherein the thyristor stack is switched on when a trigger is applied to the gate terminal of the field-effect transistor, thereby closing the field-effect transistor and shorting the second terminal of the trigger capacitor to low voltage, thereby causing a transient reduction of the voltage at the cathode terminal of the thyristor stack and the anode terminal of the blocking diode, thereby causing the voltage applied to the thyristor stack to exceed the self-break voltage.

2. The switch of claim 1, wherein the thyristor stack comprises a two-terminal thyristor and wherein the thyristor stack is switched on by causing the voltage applied to the thyristor stack to exceed the self-break voltage.

3. The switch of claim 1, wherein the thyristor stack comprises a three-terminal thyristor having a gate terminal and wherein the thyristor stack is switched on by causing the voltage applied to the thyristor stack to exceed the self-break voltage while simultaneously drawing current into the gate terminal of the three-terminal thyristor.

4. The switch of claim 3, further comprising a current limiting resistor between the gate terminal of the three-terminal thyristor and the cathode terminal of the blocking diode.

5. The switch of claim 1, wherein the field-effect transistor comprises a metal-oxide-semiconductor field-effect transistor.

6. The switch of claim 1, wherein the self-break voltage of the thyristor stack is greater than 1000 V.

7. The switch of claim 1, wherein the switch has a current carrying capacity of greater than 1 kA.

8. The switch of claim 1, wherein the switch has a time rate-of-change of current greater than 10 kA/μs.

9. The method of triggering either the switch of claim 1 or the switch of claim 3 that results in transition of the switch to the on state while carrying very little current thus enhancing the di/dt capability of the switch without device failure due to filamentation.

* * * * *